(12) United States Patent
Ueda

(10) Patent No.: US 6,290,405 B1
(45) Date of Patent: Sep. 18, 2001

(54) SUBSTRATE PROCESSING APPARATUS

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/583,907

(22) Filed: May 31, 2000

(30) Foreign Application Priority Data

Jun. 1, 1999 (JP) ................................................. 11-154056

(51) Int. Cl.$^7$ ...................................................... G03D 5/00
(52) U.S. Cl. ........................... 396/611; 414/940; 414/941
(58) Field of Search ................................. 396/604, 611, 396/627; 118/52, 319, 320, 500, 712, 719; 414/416, 986, 403, 225, 937, 939, 940, 941; 427/240; 134/902

(56) References Cited

U.S. PATENT DOCUMENTS

| | | | |
|---|---|---|---|
| 5,177,514 | 1/1993 | Ushijima et al. ..................... | 354/319 |
| 5,442,416 | 8/1995 | Tateyama et al. .................... | 354/319 |
| 5,664,254 | 9/1997 | Ohkura et al. ....................... | 396/612 |

Primary Examiner—D. Rutledge
(74) Attorney, Agent, or Firm—Rader, Fishman & Grauer

(57) ABSTRACT

A processing station for performing coating of a resist and heaping up a developing solution is connected to a cassette station into/out of which a wafer cassette is carried. In this processing station, when seen from the cassette station, a first processing unit in which antireflection film forming units and coating units are arranged with two tiers is disposed on the left side, and a second processing unit in which developing units and a peripheral edge aligner are arranged with two tiers is disposed on the right side so as to face the first processing unit. Two wafer transfer means are arranged in an area facing onto the row of each of the processing units. In such a layout, working spaces can be secured in an area between the first and second processing units.

13 Claims, 13 Drawing Sheets

SUBSTRATE PROCESSING APPARATUS

BACKGROUND OF THE INVENTION

1. Field of the Invention

The present invention relates to a substrate processing apparatus, for example, for performing coating processing of a resist solution, developing processing, and the like for a substrate such as a semiconductor wafer, a glass substrate for a liquid crystal display, or the like.

2. Description of the Related Art

In photolithography in a semiconductor device fabricating process, a resist is applied to the front face of a semiconductor wafer (hereinafter referred to as a wafer), the applied resist is subjected to exposure processing in accordance with a predetermined pattern and then developing processing, whereby the predetermined pattern of resist film is formed. Such a series of processing is performed by a system in which an aligner is connected to a coating and developing apparatus.

FIG. 13 is a plan view showing a conventional example of such an apparatus, and a substrate cassette C housing 25 substrates, for example, semiconductor wafers is carried into a cassette stage 1 of a cassette station 100. A coating block 110 and a developing block 120 are connected to the cassette station 100 in this order, and an aligner 140 is connected to the developing block 120 with an interface station 130 between them.

A wafer W in the cassette C on the cassette stage 1 is taken out by a delivery arm not illustrated, and then sent to the coating block 110 via a delivery table 10. In the coating block 110, the wafer W is coated with the resist in a coating unit 11, and then transferred by the route of a main arm A1→a delivery table 12→a main arm A2 in the developing block 120→a delivery table 13→the interface station 130→a carrying-in stage 14 of an aligner 140→a delivery arm 15→an exposure section 16, and exposed. Incidentally, in the coating block 110, before and after the coating of the resist, pre-processing and post-processing are respectively performed in a shelf unit 17a.

The exposed wafer W is transferred to the developing block 120 by the reverse route via a carrying-out stage 18 of the aligner 140, developed in a developing unit 19, and then transferred by the route of the main arm A2→the delivery table 12→the main arm A1→the delivery table 10→the cassette C. In the developing block 120, before and after the developing processing, pre-processing and post-processing are respectively performed in a shelf unit 17b.

Incidentally, since the processing speed of the aligner 140 is increasing in the aforesaid coating and developing apparatus, the processing number of wafers is required to be 150 or more in coating processing and developing processing, and hence a system provided with three coating units 11 and four developing units 14 and also provided with three antireflection film forming units each for forming an antireflection film as pre-processing of resist coating is under consideration.

In this case, it is considered that a pre-processing block is provided, for example, between the cassette station 100 and the coating block 110, and the antireflection film forming units and a main arm for transferring the wafer W, for example, are provided there.

Incidentally, in the aforesaid coating and developing apparatus, in some cases, an operator performs work for the units and the like inside the apparatus such as confirmation of the operations of the main arm A1 and the like, maintenance of the shelf units 17a and 17b, cleaning of the carrying-in stage 14 and the carrying-out stage 18 of the aligner 140, and the like. Meanwhile, in the aforesaid apparatus, spaces between the units in each block are eliminated as much as possible for the purpose of downsizing the apparatus and reducing occupied floor space. Accordingly, a space for maintenance by the operator is not secured in each block. As a result, the operator needs to do the aforesaid work from the outside of the apparatus, thereby causing disadvantages that the work is difficult, and thus maintenance and the like take a lot of time.

Further, in the aforesaid layout in which the preprocessing block is disposed between the cassette station 100 and the coating block 110, the distance between the cassette stage 1 and the aligner 140 is long. Thus, there is a disadvantage that efficiency of utilization of a clean room is deteriorated in the layout in which a depth from the cassette stage 1 is long since a transfer path for an automatic transfer robot for transferring the cassette C to the cassette stage 1 is formed along the cassette stage 1 and the transfer path is in the clean room.

SUMMARY OF THE INVENTION

The present invention is made under these circumstances, and its object is to provide a substrate processing apparatus capable of securing a working space in a processing station while downsizing the processing station.

To this end, a substrate processing apparatus of the present invention is characterized by comprising: a cassette station including a mounting section for mounting a substrate cassette housing a plurality of substrates thereon and delivery means for receiving and sending the substrate from/to the substrate cassette mounted on the mounting section; and a processing station, connected to the cassette station, for processing the substrate transferred by the delivery means, the processing station comprising: a first processing unit in which a plurality of processing sections are arranged in a direction orthogonal to the lengthwise direction of the cassette station; a second processing unit in which a plurality of processing sections are arranged so as to face the processing sections composing the first processing unit; first substrate transfer means, disposed at a position facing onto the row of the first processing unit, for receiving and sending the substrate from/to the processing sections composing the first processing unit; and second substrate transfer means, disposed at a position facing onto the row of the second processing unit, for receiving and sending the substrate from/to the processing sections composing the second processing unit, and characterized in that a working space is formed in an area between the first processing unit and the second processing unit and adjacent to the cassette station in the processing station.

In this case, the processing station may be structured to include the first processing unit in which three or more processing sections are arranged in the direction orthogonal to the lengthwise direction of the cassette station, the second processing unit in which three or more processing sections are arranged so as to face the processing sections composing the first processing unit, two or more first substrate transfer means disposed at positions facing onto the row of the first processing unit, for receiving and sending the substrate from/to the processing sections composing the first processing unit, and two or more second substrate transfer means disposed at positions facing onto the row of the second processing unit, for receiving and sending the substrate from/to the processing sections composing the second processing unit.

In such a invention, a working space is formed in an area between the first processing unit and the second processing unit and adjacent to the cassette station, thus allowing an operator to get into the working space and perform work such as maintenance and the like of the inside of the processing station, thereby facilitating the work.

The processing station may be structured to include a delivery table for the substrate for delivering the substrate between the first substrate transfer means and the second substrate transfer means. Further, the first processing unit and the second processing unit, for example, are to perform coating processing of a coating solution for the substrate, and more specifically, the apparatus comprises an interface station, which is allowed to connect with an aligner provided on the opposite side to the cassette station of the processing station and connected to the side opposite to the cassette station of the processing station, for delivering the substrate between the processing station and the aligner, the first processing unit includes a processing section for performing coating processing of a resist solution for the substrate, the second processing unit includes a processing section for performing developing processing for the substrate exposed in the aligner, and a peripheral edge aligner for performing exposure for a peripheral edge area outside a circuit forming area of the substrate for the substrate of which the circuit forming area is exposed in the aligner is provided in one section of the first processing unit or the second processing unit, in which case the interface station can be downsized.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
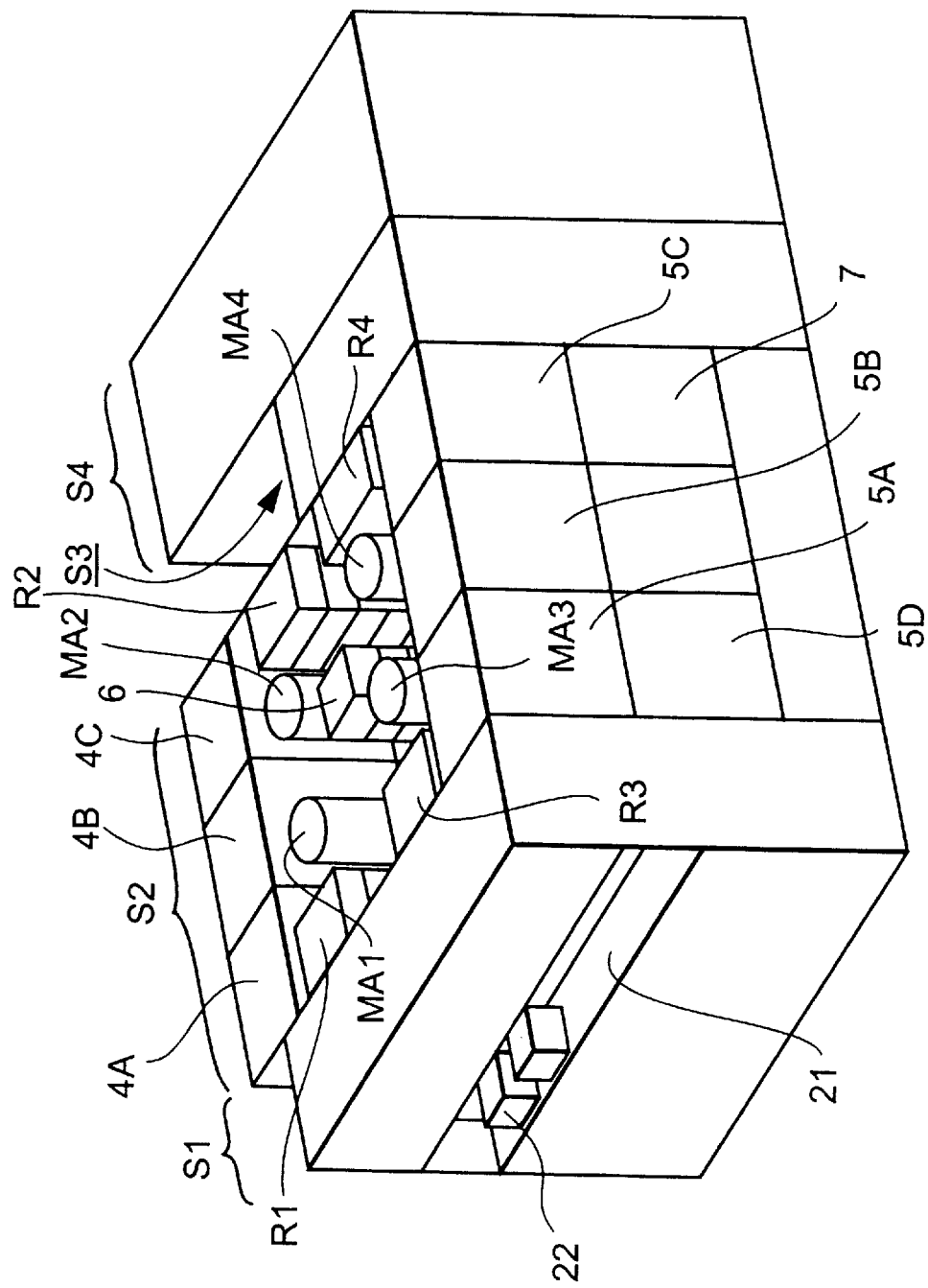
FIG. 1 is a general view showing a coating and developing apparatus according to an embodiment of the present invention.
Figure 2:
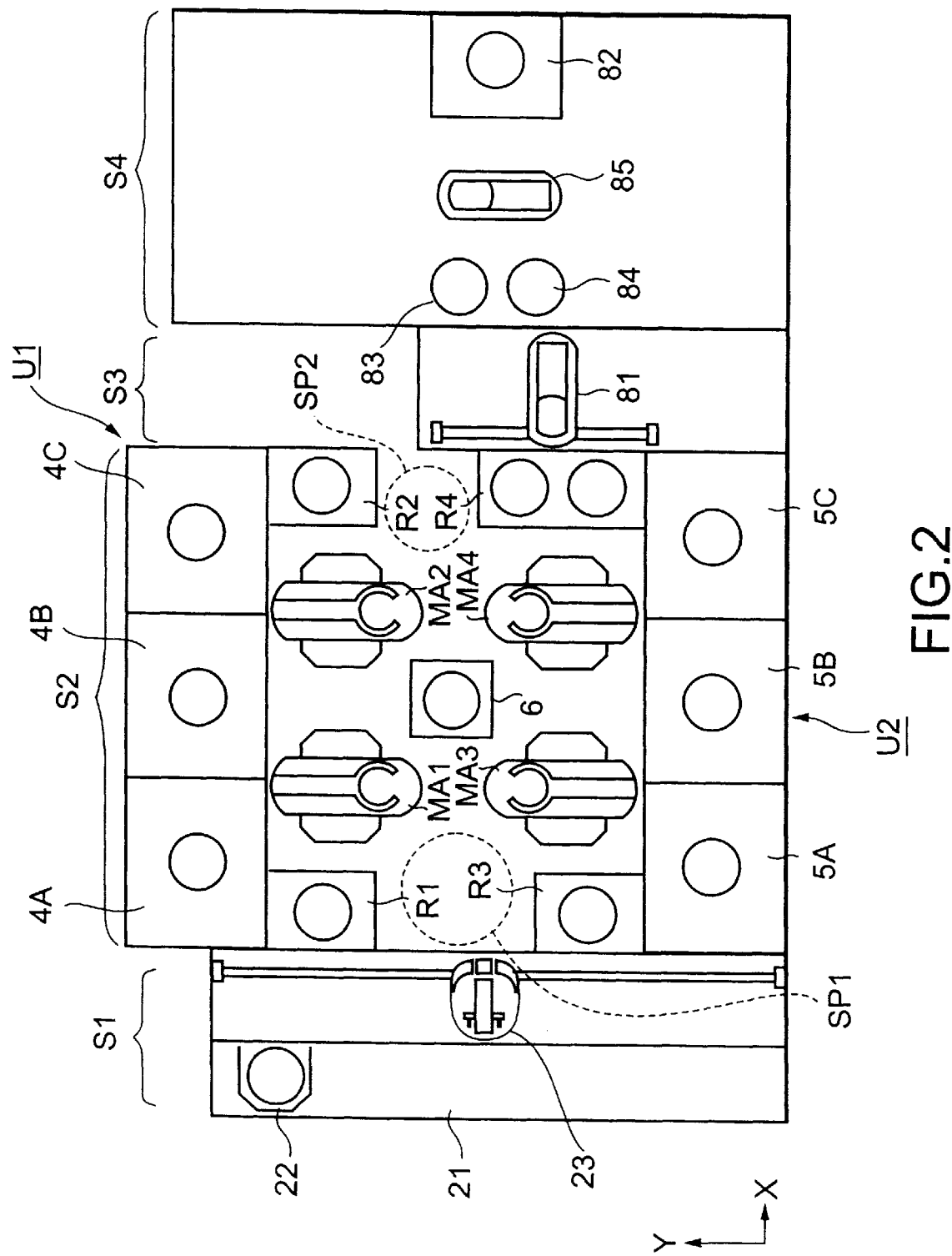
FIG. 2 is a schematic plan view showing the coating and developing apparatus.

A Preferred embodiment in which the present invention is applied to a coating and developing apparatus for a substrate will be described below. FIG. 1 is a general view showing the inside of this embodiment in perspective, and FIG. 2 is a schematic plan view. The symbol and numeral S1 in FIGS. 1 and 2 is a cassette station, S2 is a processing station for performing coating processing of a resist, a developing processing, and the like for a wafer W, S3 is an interface station, and S4 is an aligner.

The cassette station S1 includes a cassette stage 21 on which wafer cassettes (hereinafter referred to as "cassettes") 22 constituting, for example, four substrate cassettes each housing a plurality of substrates, for example, 25 wafers W are mounted and a delivery arm 23 constituting a delivery means for delivering the wafer W between the cassette 22 on the cassette stage 21 and a delivery section of the processing station S2 which will be described later. The delivery arm 23 is structured to be ascendable and descendable, movable in an X-direction and a Y-direction, and rotatable around a vertical axis.

The processing station S2 is structured to include, for example, three antireflection film forming units 3 (3A, 3B, and 3C), for example, three coating units 4 (4A, 4B, and 4C), for example, four developing units 5 (5A, 5B, 5C, and 5D), for example, four shelf units R (R1, R2, R3, and R4) each having multi-tiered shelves, a plurality of, for example, two first wafer transfer means MA1 and a second wafer transfer means MA2 in all which are first substrate transfer means, a plurality of, for example, two third wafer transfer means MA3 and fourth transfer means MA4 in all which are second substrate transfer means, a delivery unit 6 for the wafer W, and a peripheral edge aligner 7, to transfer the wafer W between the cassette station S1 and the interface station S3, and to perform processing of forming an antireflection film on the wafer W, processing of coating the wafer W with a resist, processing of developing the wafer W, and processing of heating and cooling the wafer W to predetermined temperatures before and after the aforesaid processing therein.

Figure 3:
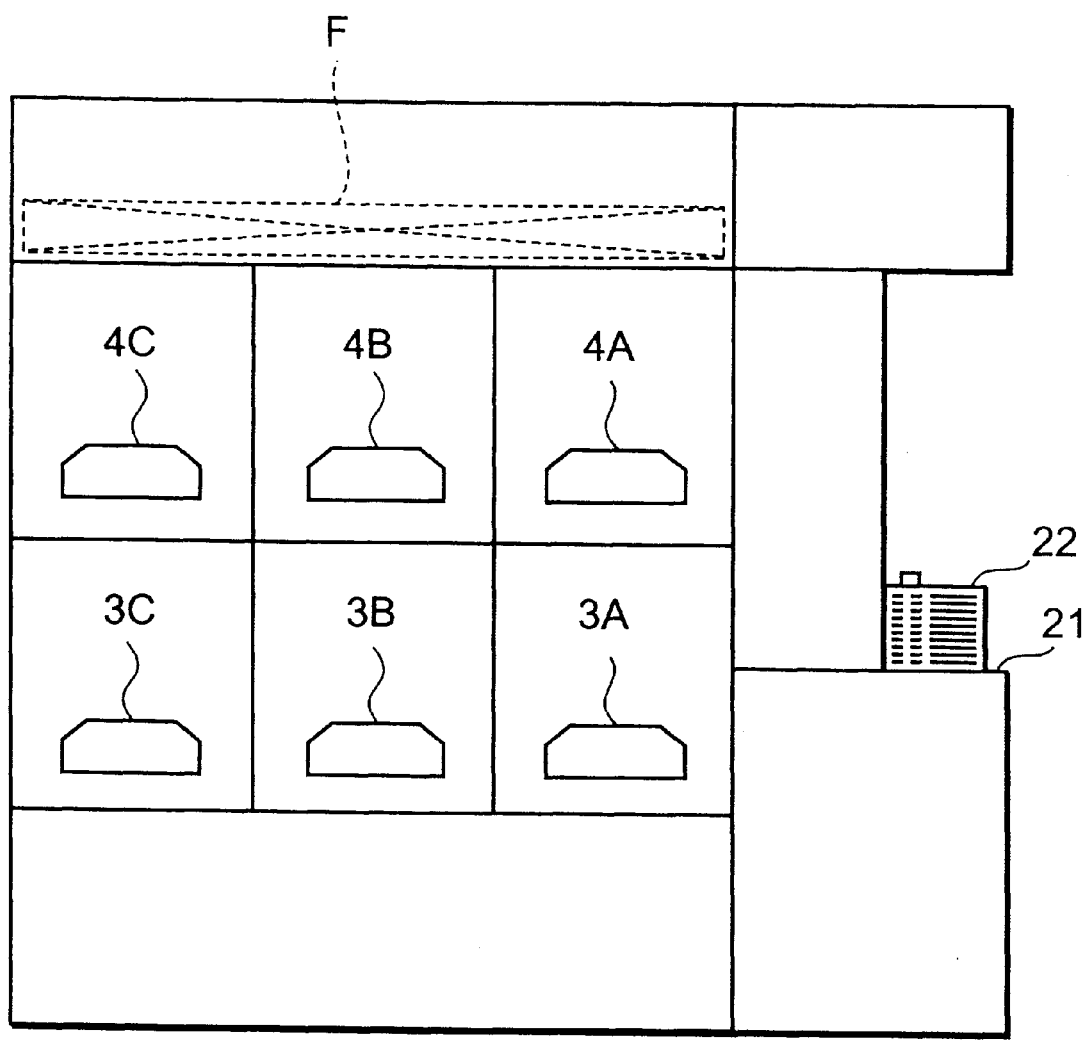
FIG. 3 is a schematic left side view showing the coating and developing apparatus.

An example of the layout of the inside of this station S2 will be explained. As shown in FIG. 3, for example, provided on the left side of the station S2 as seen from the cassette station S1 is a first processing unit U1 in which six processing sections are arranged with two tiers each with three sections. The processing sections are arranged in a row in a direction orthogonal to the lengthwise direction of the cassette station S1, and the lower processing sections are allocated, for example, to three antireflection film forming units 3A, 3B, and 3C with the antireflection film forming unit 3A at the front thereof, and the upper ones are allocated to three coating units 4A, 4B, and 4C with the coating unit 4A at the front thereof.

Figure 4:
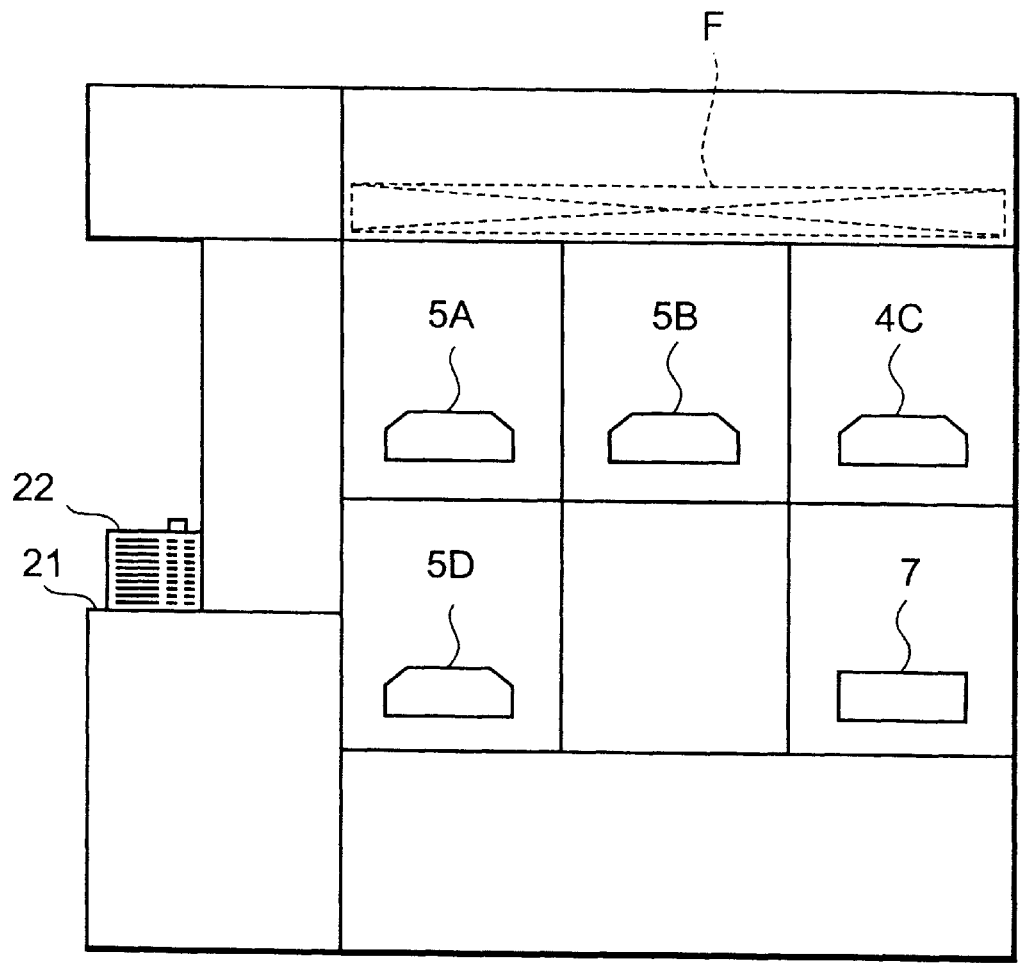
FIG. 4 is a schematic right side view showing the coating and developing apparatus.

Meanwhile, provided on the right side of the station S2 as seen from the cassette station S1 is a second processing unit U2 facing the first processing unit U1. Also, in the second processing unit U2, six processing sections are arranged with two tiers each with three sections, and as shown in FIG. 4, the upper three processing sections are allocated, for example, to three developing units 5A, 5B, and 5C with the developing unit 5A at the front thereof, and one processing section on the cassette station S1 side at the lower tier is allocated to the developing unit 5D. Moreover, the backmost section behind the developing unit 5D at the lower tier as seen from the cassette station S1, for example, is allocated to the peripheral edge aligner 7. It should be mentioned that in explanation hereafter the cassette station S1 side is taken as the front and the aligner S4 side is taken as the back.

The four of shelf units R, the four of wafer transfer means MA (MA1, MA2, MA3, and MA4), and the delivery unit 6 deliver the wafer W between the cassette station S1 and the interface station S3 via a delivery section which will be described later of any of the shelf units R, and they are laid out so that the wafer W is delivered between the shelf units R, and the antireflection film forming units 3, the coating units 4, and the developing units 5 by any of the wafer transfer means MA and so that the wafer W is delivered between the wafer transfer means MA via the delivery unit 6.

Arranged in an area between the first and second processing units U1 and U2 extending from the cassette station S1 to the back, for example, are the first shelf unit R1 on the right side of the first processing unit U1 as seen from the cassette station S1 and the third shelf unit R3 on the left side of the second processing unit U2 as seen from the cassette station S1 respectively adjacent to the cassette station S1, and arranged on the interface station S3 side are the second shelf unit R2 on the right side of the first processing unit U1 as seen from the cassette station S1 and the fourth shelf unit R4 on the left side of the second processing unit U2 as seen from the cassette station S1 respectively.

The first and second wafer transfer means MA1 and MA2 are arranged side by side with the first wafer transfer means MA1 at the front thereof at the back of the first shelf unit R1 on the right side of the first processing unit U1 as seen from the cassette station S1, for example, so as to respectively deliver the wafer W between the first shelf unit R1, and the antireflection film forming units 3A and 3B and the coating units 4A and 4B, and between the second shelf unit R2, and the antireflection film forming units 3B and 3C and the coating units 4B and 4C.

The third and fourth wafer transfer means MA3 and MA4 are arranged side by side with the third wafer transfer means MA3 at the front thereof at the back of the third shelf unit R3 on the left side of the second processing unit U2 as seen from the cassette station S1, for example, so as to respectively deliver the wafer W between the third shelf unit R3 and the developing units 5A, 5B and 5D, and between the fourth shelf unit R4, and the developing units 5B and 5C and the peripheral edge aligner 7. Further, in an area surrounded by the four wafer transfer means MA, the delivery unit 6 is disposed at a position to which these wafer transfer means MA are accessible.

Figure 5:
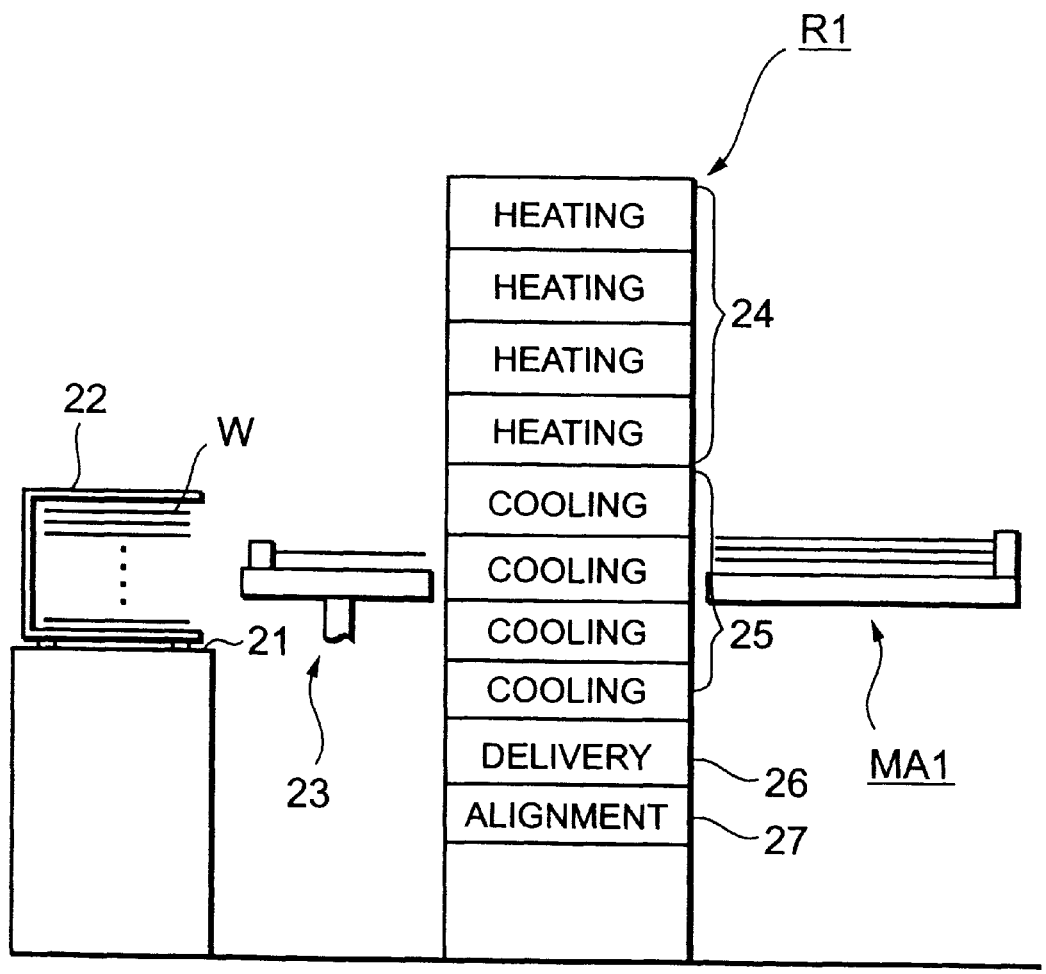
FIG. 5 is a side view showing an example of a shelf unit.
Figure 6A:
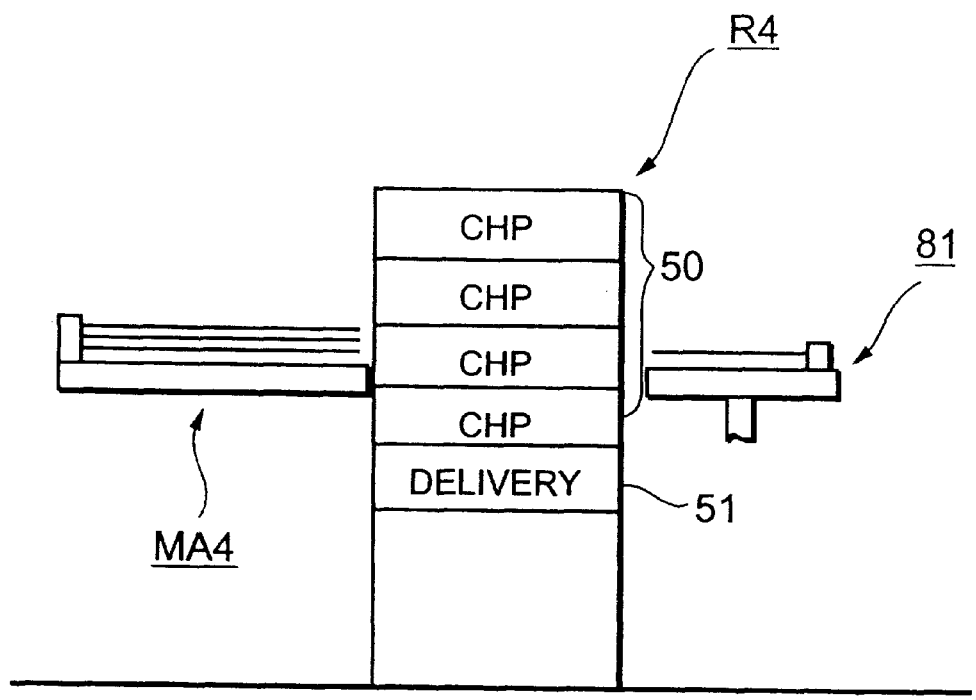
FIG. 6(A) is a side view showing another example of the shelf unit.

As shown in FIG. 5 with the shelf unit R1 as a representative, in the shelf unit R1 (R2, R3), heating sections 24 each for heating the wafer W and cooling sections 25 each for cooling the wafer W are disposed vertically. In each of the shelf units R1 and R2, a delivery section 26 including a delivery table for receiving and sending the wafer W from/to the cassette station S1 is provided, and in the shelf unit R1, an alignment section 27 for aligning the wafer W is provided. Moreover, as shown in FIG. 6(A), in the shelf unit R4, CHP devices 50 each for heating and cooling the wafer W and a delivery section 51 including a delivery table for receiving and sending the wafer W from/to the interface station S3 are disposed vertically.

In the heating section 24, the wafer W is heated to a predetermined temperature by mounting the wafer W on the front face of a hot plate heated, for example, by a heater. In the cooling section 25, the wafer W is cooled to a predetermined temperature by mounting the wafer W on the front face of a chill plate cooled by letting a refrigerant flow.

Figure 6B:
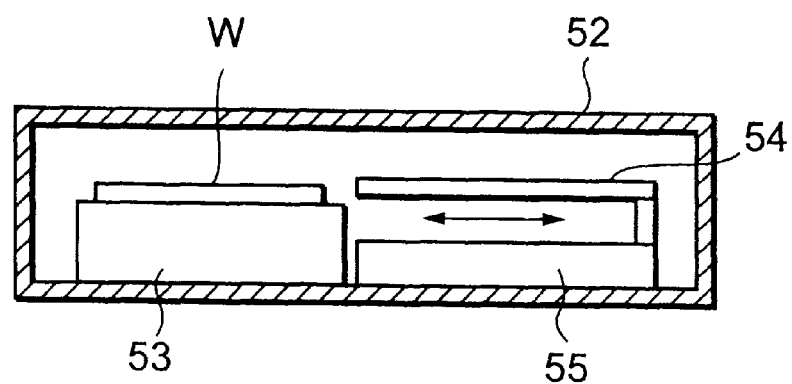
FIG. 6(B) is a sectional view showing a CHP device.

As shown in FIG. 6(B), the CHP device includes a hot plate 53 for heating the wafer W and a chill plate 54 for cooling the wafer W, and a transfer means 55 for moving the chill plate 54 between a position above the hot plate 53 and a position adjacent to the hot plate 53 inside a processing chamber 52. In this device, the wafer W is first mounted on the hot plate 53 and heated to a predetermined temperature, thereafter the wafer W is lifted off the front face of the hot plate 53 by being raised by a protruding pin not illustrated and concurrently the chill plate 54 is moved to a position under the wafer W, then the wafer W is delivered to the chill plate 54 by cooperative operations of the protruding pin and the transfer means 55, and thus the wafer W is cooled to a predetermined temperature. Hence, heating time is controlled by the delivery of the wafer W between the hot plate 53 and the chill plate 54 by the transfer means 55, thereby preventing over-bake.

Figure 7:
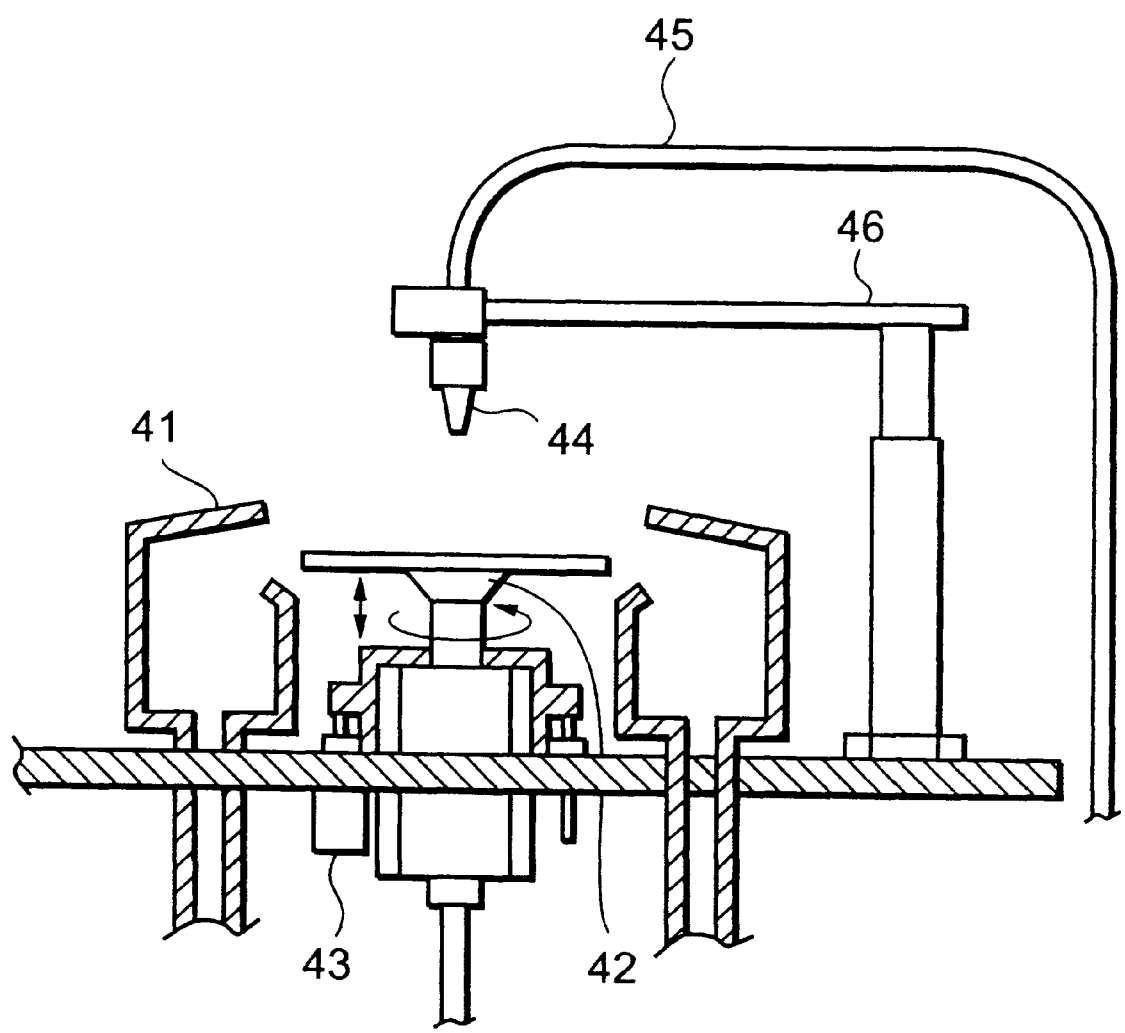
FIG. 7 is a sectional view showing a coating unit.

When the coating unit 4 is explained, for example, based on FIG. 7, the numeral 41 is a cup, and a rotatable spin chuck 42 having a function of vacuum suction is provided in the cup 41. The spin chuck 42 is structured to be ascendable and descendable by means of a raising and lowering mechanism 43, and when the spin chuck 42 is positioned at the upper side of the cup 41, the delivery of the wafer W from/to an arm which will be described later of the wafer transfer means MA is performed.

As for the delivery of the wafer W, the spin chuck 42 relatively rises from the lower side of the cup 41 and receives the wafer W on the arm at the upper side thereof, while the wafer W is delivered from the spin chuck 42 side to the arm by operation reverse to the above. The numeral 44 is a discharge nozzle, 45 is a resist solution supply pipe, 46 is a supporting arm for horizontally moving the nozzle. In such a coating unit 4, a resist solution being a coating solution is dropped from the discharge nozzle 44 to the front face of the wafer W on the spin chuck 42, and spread and applied over the wafer W by rotating the spin chuck 42.

The antireflection film forming unit 3 and the developing unit 5 have almost the same structure as the coating unit 4, but the developing unit 5 is structured so that the discharge nozzle 44 includes, for example, a large number of supply ports arranged in the direction of the diameter of the wafer W and that the developing solution is discharged from the discharge nozzle 44 to the front face of the wafer W on the spin chuck 42 and heaped up by rotating the spin chuck 42 a half turn, whereby the film of the developing solution is formed.

Figure 8:
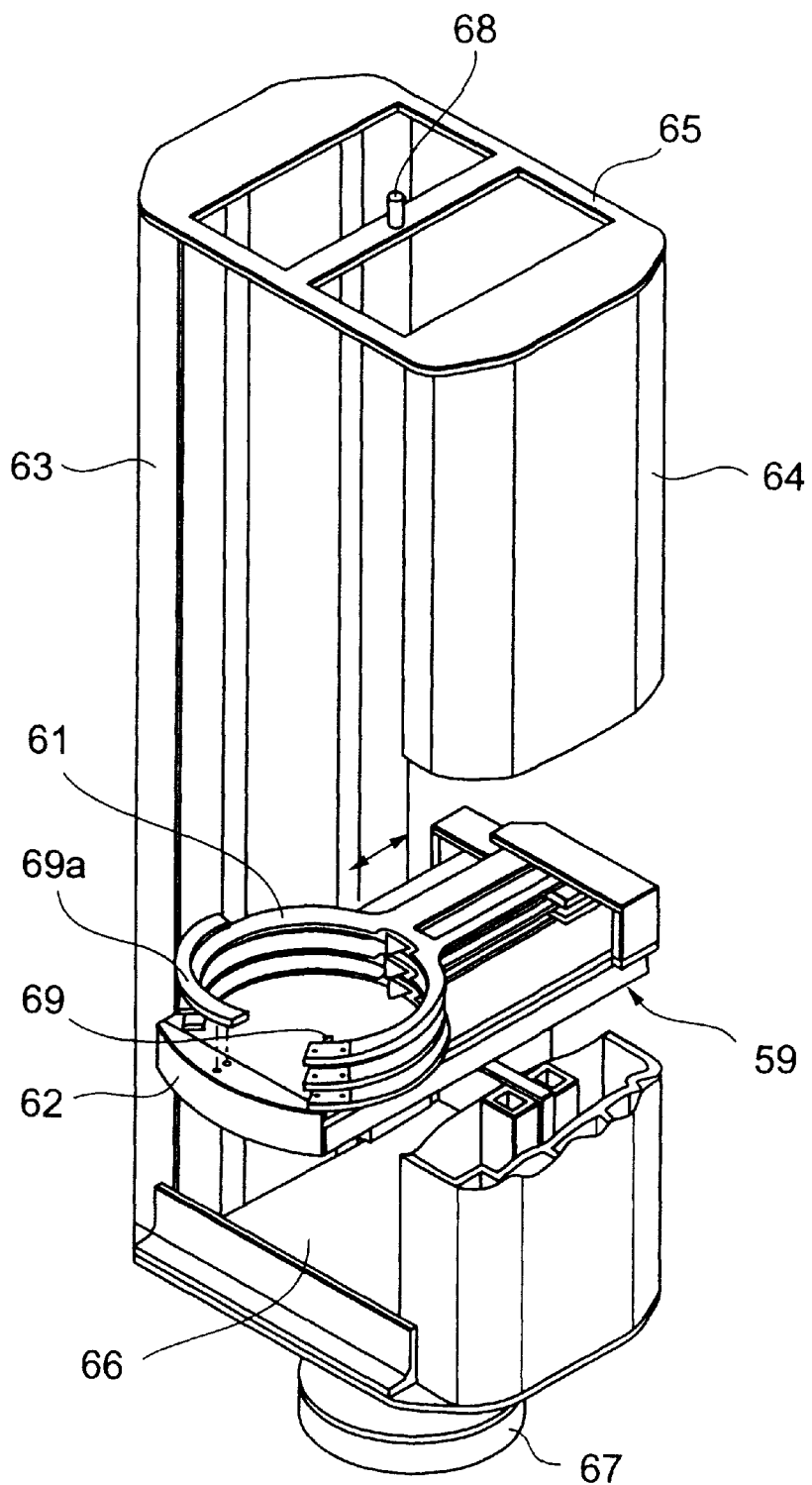
FIG. 8 is a perspective view showing a wafer transfer means.

The wafer transfer means MA1, MA2, MA3, and MA4 are structured identically, and as shown in FIG. 8, for example, each of them includes an arm 61 for holding the wafer W, a base 62 for supporting the arm 61 so that the arm can freely move forward and backward, a pair of guide rails 63 and 64 for ascendably and descendably supporting the base 62, coupling members 65 and 66 respectively for coupling the upper ends and the lower ends of the guide rails 63 and 64, a rotational drive portion 67 integrally attached to the coupling member 66 at the lower ends of the guide rails for driving a frame body composed of the guide rails 63 and 64 and the coupling members 65 and 66 so that the frame body can freely rotate around a vertical axis, and a rotating shaft portion 68 provided on the coupling member 65 at the upper ends of the guide rails.

The arm 61 has a three-stage structure so as to hold the wafer W on each stage, and the peripheral edge of the wafer W is placed on, for example, three claw portions 69 provided at respective stages. A base end portion of the arm 61 can move sliding along a guide groove 59 provided in the longitudinal direction of the base 62. The forward and backward movement of the arm 61 by the sliding movement is drive-controlled by a drive means not illustrated. The ascending and descending movement of the base 62 is drive-controlled by another drive means not illustrated. Hence, these two drive means not illustrated, guide groove 59, guide rails 63 and 64, and rotational drive portion 67 compose a drive section for driving the arm 61 so that the arm can freely rotate around the vertical axis and freely move ascendably and descendably, and forward and backward. Incidentally, the numeral 69a is a sensor supporting member to which a photosensor for detecting the presence or absence of the wafer W on the arm 61 is attached, and the sensor supporting member is fixed to the base 62.

Figure 9:
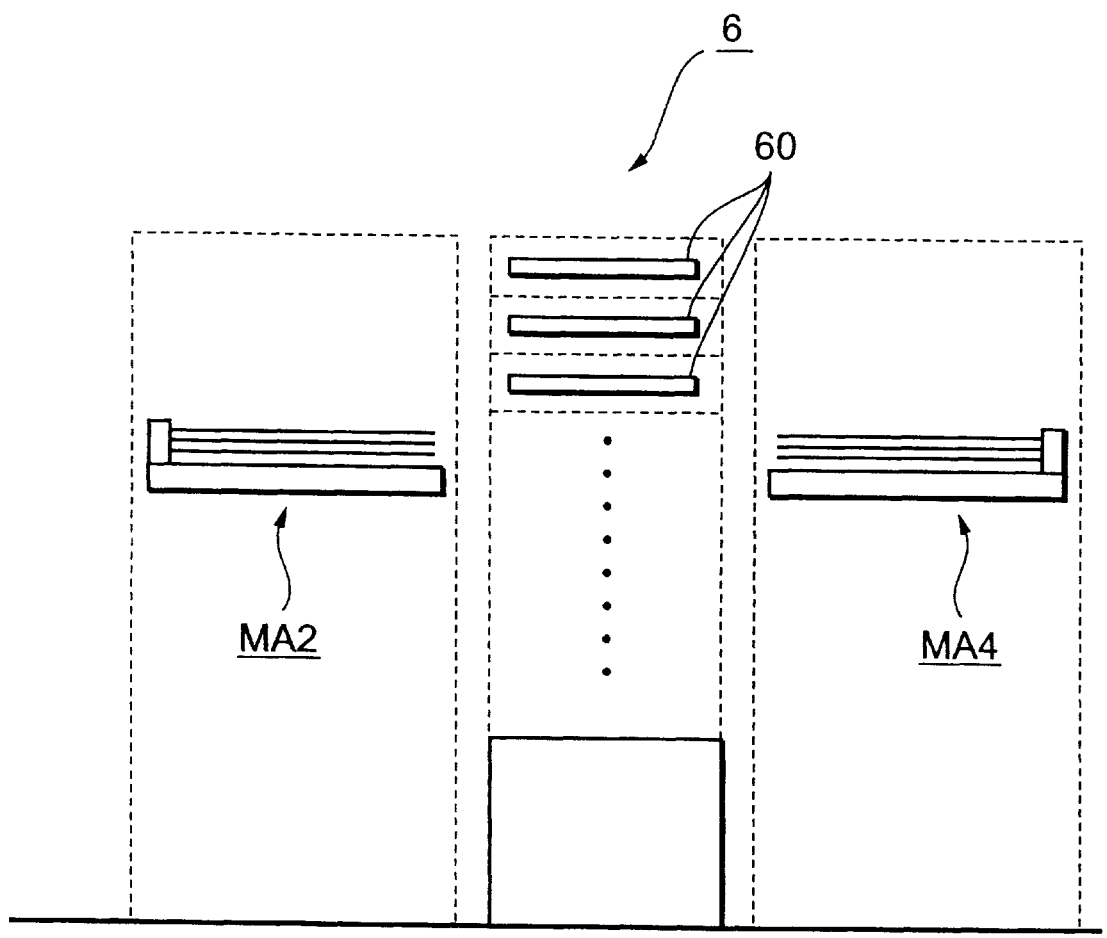
FIG. 9 is a sectional view showing a delivery unit.

The delivery unit 6 for the wafer W is used for delivering the wafer W between the wafer transfer means MA, for example, between the second wafer transfer means MA2 and the fourth wafer transfer means MA4, and, for example, as shown in FIG. 9, a plurality of, for example, three delivery tables 60 for the wafer W are disposed vertically. The delivery table 60 is provided with a plurality of pins each having such a height that the arm 61 of the wafer transfer means MA does not hit each pin at positions nearly corresponding to the center of the wafer W on the upper face of a plate, and structured so that the arm 61 is lowered after the wafer W is mounted on these pins and then withdrawn to thereby deliver the wafer W to the delivery table 60. Incidentally, the delivery sections 26 and 51 of the shelf units R are structured similarly. It is preferable to arrange the delivery tables 60 at the upper positions, thereby securing a passage between working spaces SP1 and SP2.

Figure 10A:
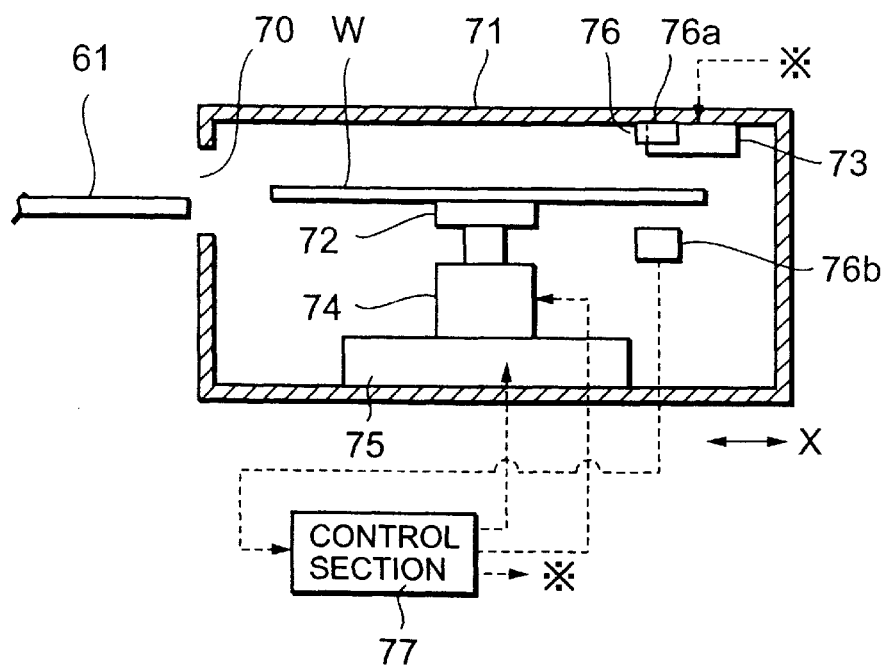
FIG. 10(A) and FIG. 10(B) are a side view and a plan view showing a peripheral edge aligner.
Figure 10B:
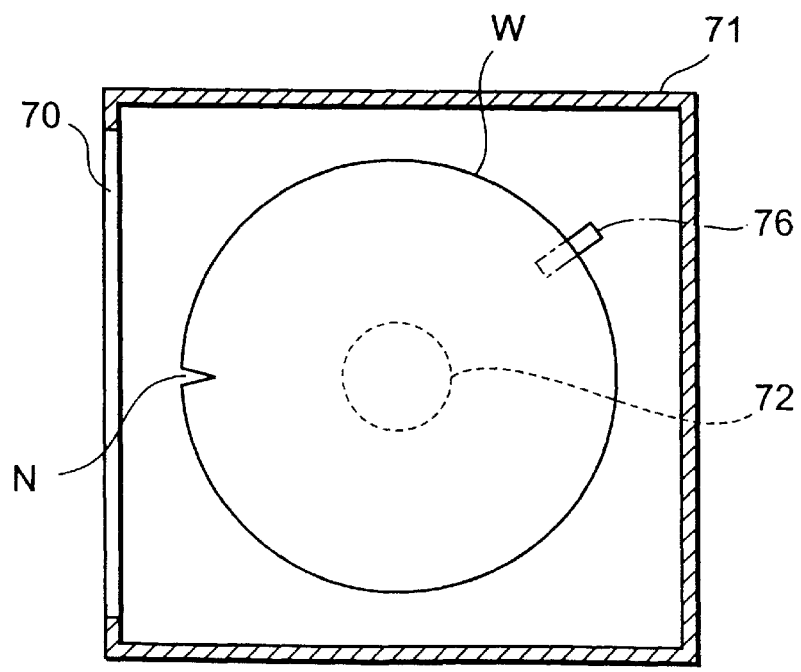

After a device area which is a circuit forming area is exposed in the aligner S4, the peripheral edge aligner 7 exposes a peripheral edge area outside the device area because there is a possibility that the remnant of the resist in this area causes the occurrence of particles in the subsequent processes. As shown in FIG. 10(A) and FIG. 10(B), for example, this peripheral edge aligner includes, for example, a chuck 72 for vacuum-sucking the wafer W and an exposure section 73 for exposing the peripheral edge of the wafer W in a case 71 having a transfer port 70 for the wafer W. The chuck 72 is rotatable around a vertical axis and movable in the X-direction by a rotating mechanism 74 and an X-mechanism 75. The numeral 76 in FIGS. 10(A) and 10(B) is a peripheral edge detecting element for detecting the peripheral edge of the wafer W, composed of a line sensor provided with a light emitting element 76a and a light receiving element 76b, for example, so that an area which the peripheral edge of the wafer W passes is sandwiched vertically between the elements 76a and 76b.

In such a peripheral edge aligner, the wafer W is delivered to the chuck 72 in the case 71 by the arm 61 of the fourth wafer transfer means MA4, and rotated, for example, one full turn by the chuck 72. On this occasion, the peripheral edge, that is, the border line of the wafer W is detected by the peripheral edge detecting element 76. Since the positional relationship between the peripheral edge detecting element 76 and the exposure section 73 is determined, a control section 77 can know the position of the wafer W with respect to the exposure section 73 based on detected data of the border line. Namely, the position of the center of the wafer W with respect to the position of an exposure spot of the exposure section 73, and, for example, the position of a notch N are known. Incidentally, the notch N is a V-shaped slot for showing crystal orientation of the wafer W and takes the place of an orientation flat. Subsequently, the rotating mechanism 74 and the X-mechanism 75 are controlled so that the exposure spot is positioned in the peripheral edge area (the area ranging from the peripheral edge slightly to the inside and the area outside the device area) of the wafer W and then the peripheral edge area is exposed.

Thus, in the processing station S2, the wafer W is delivered from/to the shelf unit R1, the antireflection film forming units 3A and 3B, the coating units 4A and 4B, and the delivery unit 6 by the first wafer transfer means MA1, delivered from/to the shelf unit R2, the antireflection film forming units 3B and 3C, the coating units 4B and 4C, and the delivery unit 6 by the second wafer transfer means MA2, delivered from/to the shelf unit R3, the developing units 5A, 5B, an 5D, and the delivery unit 6 by the third wafer transfer means MA3, and delivered from/to the shelf unit R4, the developing units 5B and 5C, the delivery unit 6, and the peripheral edge aligner 7 by the fourth wafer transfer means MA4.

In an area between the first processing unit U1 and the second processing unit U2 in the processing station S2, the four shelf units R are disposed on the outside thereof and the four wafer transfer means MA are disposed on the inside thereof, and hence the working spaces SP1 and SP2 which an operator can enter are formed respectively in an area between the first shelf unit R1 and the third shelf unit R3 and adjacent to the cassette station S1, and in an area between the second shelf unit R2 and the fourth shelf unit R4 and adjacent to the interface station S3.

Figure 11:
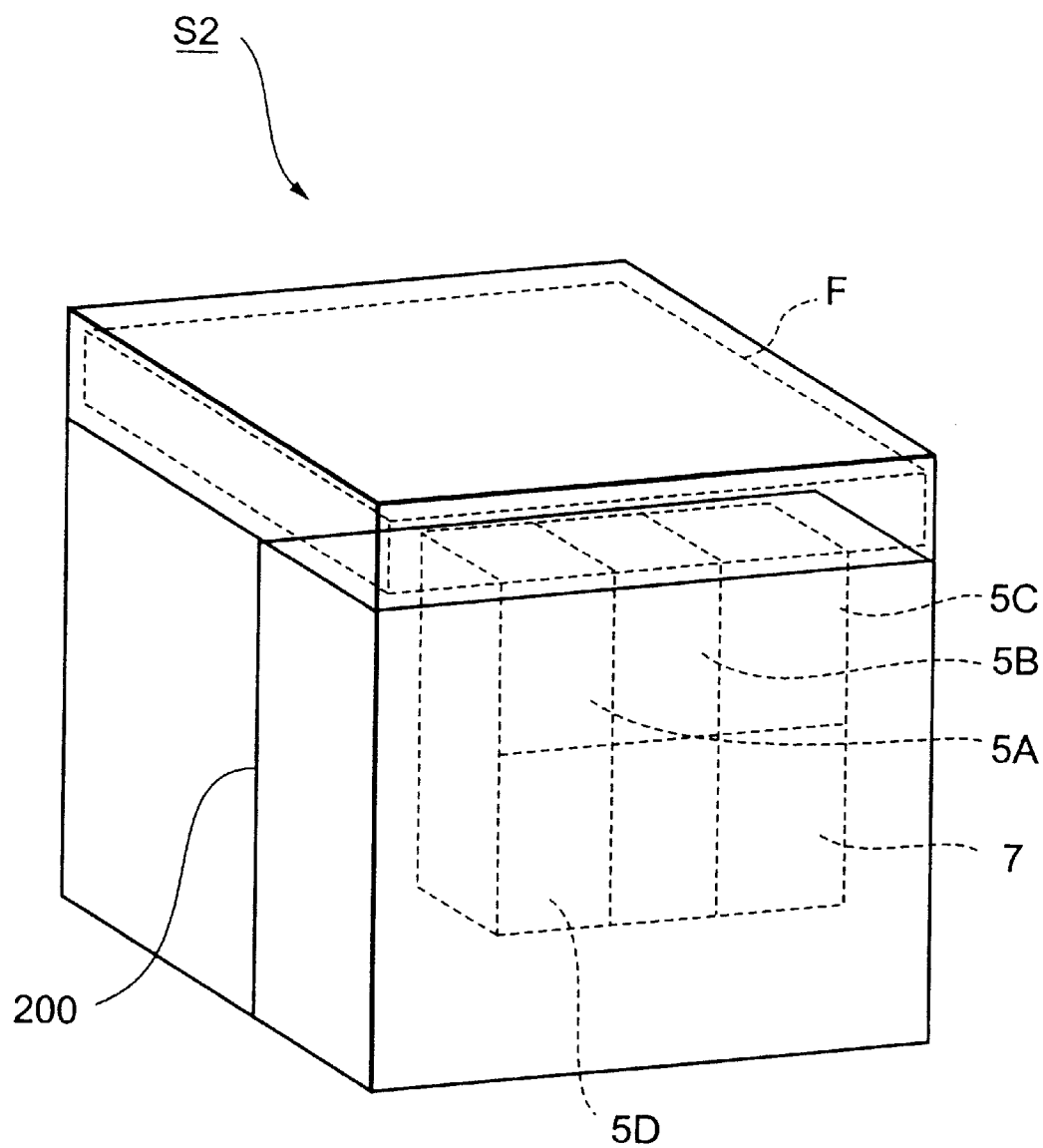
FIG. 11 is a general view showing a processing station.

Moreover, the second processing unit U2 is spatially closed to other areas. Specifically, the right and left sides thereof are wall portions constituting the exterior body of the main body of the apparatus, and a partition wall 200 is provided between the unit U2 and the area in which the wafer transfer means MA are provided (See FIG. 11), and a filter unit F is provided in a ceiling portion so that clean air enters the unit U2 through the filter unit F. The filter unit F is provided, for example, so as to cover the upper side of the processing station S2. A delivery port not illustrated for the wafer W is formed in the partition wall.

The filter unit F includes a filter for cleaning air, a chemical filter to which acid components are added to remove alkaline components in the air such as ammonia components and amine, a suction fan, a heating mechanism, a humidifying mechanism, and the like, and the air which is cleaned, from which alkaline components are removed, and which is regulated at predetermined temperature and humidity is sent out into an under processing space. When a chemically amplified resist is used as a resist solution, for example, it is required to prevent entry of alkaline components into a developing processing atmosphere, and therefore the interior of the second processing unit U2 is made a closed space and the entry of alkaline components from the outside is prevented by using the chemical filter.

Acids are produced by exposing the chemically amplified resist, and the acids are diffused by heat processing and act as catalyst, and as a result, decompose base resin which is the main component of a resist material or change its molecular structure to make it soluble in the developing solution. Accordingly, in the case where this kind of resist is used, when alkaline components such as a very small amount of ammonia contained in air or amine produced from paint on walls come in contact with acids on the surface portion of the resist, a catalytic reaction by the acids is suppressed, thus deteriorating the shape of a pattern. Consequently, the removal of alkaline components is needed.

Returning to the explanation of the entire apparatus, the interface station S3 is connected adjacent to the processing station S2, and the aligner S4 for exposing the wafer W on which a resist film is formed is connected at the back of the interface station S3. The interface station S3 is provided with a delivery arm 81 for delivering the wafer W between the processing station S2 and the aligner S4. The delivery arm 81 is disposed at a position where the wafer W is delivered from/to the delivery section 51 of the fourth shelf unit R4, and therefore the interface station S3 is provided on the second processing unit U2 side, and the length thereof in the Y-direction is shorter than that of the processing station S2, whereby a space which the operator can get into is secured in an area adjacent to the first processing unit U1 side in the processing station S2.

The aligner 4 includes an exposure section 82 for exposing the device area of the wafer W, a carrying-in stage 83 and a carrying-out stage 84 for receiving and sending the wafer W from/to the delivery arm 81, and a delivery arm 85 for delivering the wafer W between the carrying-in stage 83 or the carrying-out stage 84 and the exposure section 82. The carrying-in stage 83 and the carrying-out stage 84 are disposed at positions near the space between the processing station S2 and the aligner S4 at a position close to the left end of the interface station S3 as seen from the cassette station S1.

Next, the operation of the aforesaid embodiment will be explained. First, the cassette 22 housing, for example, 25 wafers W is carried into the cassette stage 21 by an automatic transfer robot (or the operator), and one wafer W is taken out of the cassette 22 by the delivery arm 23 and placed on the delivery section 26 in the shelf unit R1 in the processing station S2. Subsequently, the wafer W is transferred to the antireflection film forming unit 3A by the first wafer transfer means MA1, where an antireflection film is formed. If the chemically amplified resist is used, reflection is caused on the lower side of the resist during exposure, and hence the antireflection film is formed as above for preventing the reflection.

Subsequently, the wafer W is transferred, for example, by the route of the first wafer transfer means MA1→the heating section 24 of the first shelf unit R1→the cooling section 25→the coating unit 4B, and heated to a predetermined temperature in the heating section 24 and cooled to a predetermined temperature in the cooing section 25, and thereafter coated with the resist in the coating unit 4B. The wafer W in the coating unit 4B is then transferred, for example, by the route of the second wafer transfer means MA2→the heating section 24 of the second shelf unit R2→the cooling section 25, and heated to a predetermined temperature in the heating section 24 and then cooled to a predetermined temperature in the cooling section 25. Thereafter, the wafer W is transferred, for example, by the route of the second wafer transfer means MA2→the delivery table 60 of the delivery unit 6→the fourth wafer transfer means MA4→the delivery section 51 of the fourth shelf unit R4→the delivery arm 81 of the interface station S3→the carrying-in stage 83 of the aligner S4→the delivery arm 85→the exposure section 82, and the device area is exposed.

The exposed wafer W is transferred to the processing station S2 by the reverse route, that is, the exposure section 82→the delivery arm 85→the carrying-out stage 83→the delivery arm 81 of the interface station S3→the delivery section 51 of the fourth shelf unit R4→the fourth wafer transfer means M4, and then transferred first to the peripheral edge aligner 7 by the fourth wafer transfer means MA4, where the peripheral edge area of the device area is exposed. Subsequently, the wafer W is transferred, for example, by the route of the fourth wafer transfer means MA4→the CHP device 50 of the fourth shelf unit R4, where the wafer W is heated to a predetermined temperature and thereafter cooled to a predetermined temperature to prevent over-bake. The wafer W is then transferred, for example, by the route of the fourth wafer transfer means MA4→the developing unit 5B and subjected to developing processing in the developing unit 5B.

Thereafter, the wafer W is transferred, for example, by the route of the third wafer transfer means MA3→the heating section 24 of the third shelf unit R3→the cooling section 25, and after temporarily heated to a predetermined temperature, cooled to a predetermined temperature. The wafer W is then returned into the original cassette 22 via the delivery section 26 of the third shelf unit R3, for example, by the third wafer transfer means MA3.

In the processing station S2, the wafers W are sent to the delivery section 26 of the first shelf unit R1 one by one, and each wafer W is transferred by the route of the vacant antireflection film forming unit 3→the vacant heating section 24→the vacant cooling section 25→the vacant coating unit 4→the vacant heating section 24→the vacant cooling section 25, and the wafer W which has undergone exposure is transferred by the route of the peripheral edge aligner 7→the vacant CHP device 50→the vacant developing unit 5→the vacant heating section 24→the vacant cooling section 25. The delivery of the wafer W between the wafer transfer means MA is sometimes required, in which case the delivery is carried out via the delivery unit 6.

In the aforesaid embodiment, in the processing station S2, the first processing unit U1 and the second processing unit U2 are provided facing each other on the left and right sides when seen from the cassette station S1, and two shelf units R and two wafer transfer means MA are provided in a row at positions facing onto the row of each of the processing units U1 and U2 in an area between the first and second processing units U1 and U2, whereby the entire apparatus can be downsized since the depth thereof from the cassette station S1 is shortened, and consequently an area between the first and third shelf units R1 and R3 and an area between the second and fourth shelf units R2 and R4 as seen from the cassette station S1 are widened, and thus these areas can be secured as the working spaces SP1 and SP2. The secureness of such wide working spaces allows the operator to enter these spaces and to perform the maintenance of the shelf units R and confirmation work of the operations of the wafer transfer means MA, thereby facilitating such work as compared with a case where such work is performed from the outside of the apparatus, resulting in shorter working hours.

Further, since the wafer transfer means MA are provided at positions facing onto the row of each of the first and second processing units U1 and U2 in the processing station S2, the wafer W can be transferred without the transfer routes of the wafer W to the aligner S4 and from the aligner S4 overlapping each other. Accordingly, there is no waste in transfer route, and thus the wafer W can be transferred in a short time.

In the layout of the aforesaid embodiment, the Y-directional length of the processing station S2 is long, while the X-directional length thereof is short as described above. As a result, the distance between the cassette station S1 and the aligner S4 is short and the depth from the cassette station S1 is short, which improves efficiency of utilization of a clean room.

Further, in the layout of the aforesaid embodiment, the peripheral edge aligner 7 which has been hitherto provided in the interface station S3 is housed in the second processing unit U2, and the wafer W is delivered to/from the peripheral edge aligner by the fourth wafer transfer means MA4 and delivered to/from the interface station S3 via the delivery section 51 of the fourth shelf unit R4, and hence the delivery arm 81 only is provided in the interface station S3, whereby the station S3 can be downsized. It should be noted that in the conventional structure in which the peripheral edge aligner 7 is provided in the interface station S3, it is necessary to provide a delivery arm for the peripheral edge aligner 7 and a dedicated delivery arm for the aliger S4 to increase the total transfer capacity and to perform high-speed processing, resulting in an increase in the size of the interface station S3.

Accordingly, as described above, the working space which the operator can enter can be secured in the area between the first processing unit U1 of the processing station S2 and the aligner S4, and if the operator gets into this space, the carrying-in stage 83 and the carrying-out stage 84 become closer to him or her, and thereby such work that the operator wipes these stages can be performed easily. When such a working space does not exist, a working space needs to be provided in an area adjacent to the aligner S4 by pulling out the interface station S3 in order to wipe the carrying-in and carrying-out stages 83 and 84, and moreover this work needs to be performed at frequent intervals, which causes the operator considerable trouble.

Figure 12:
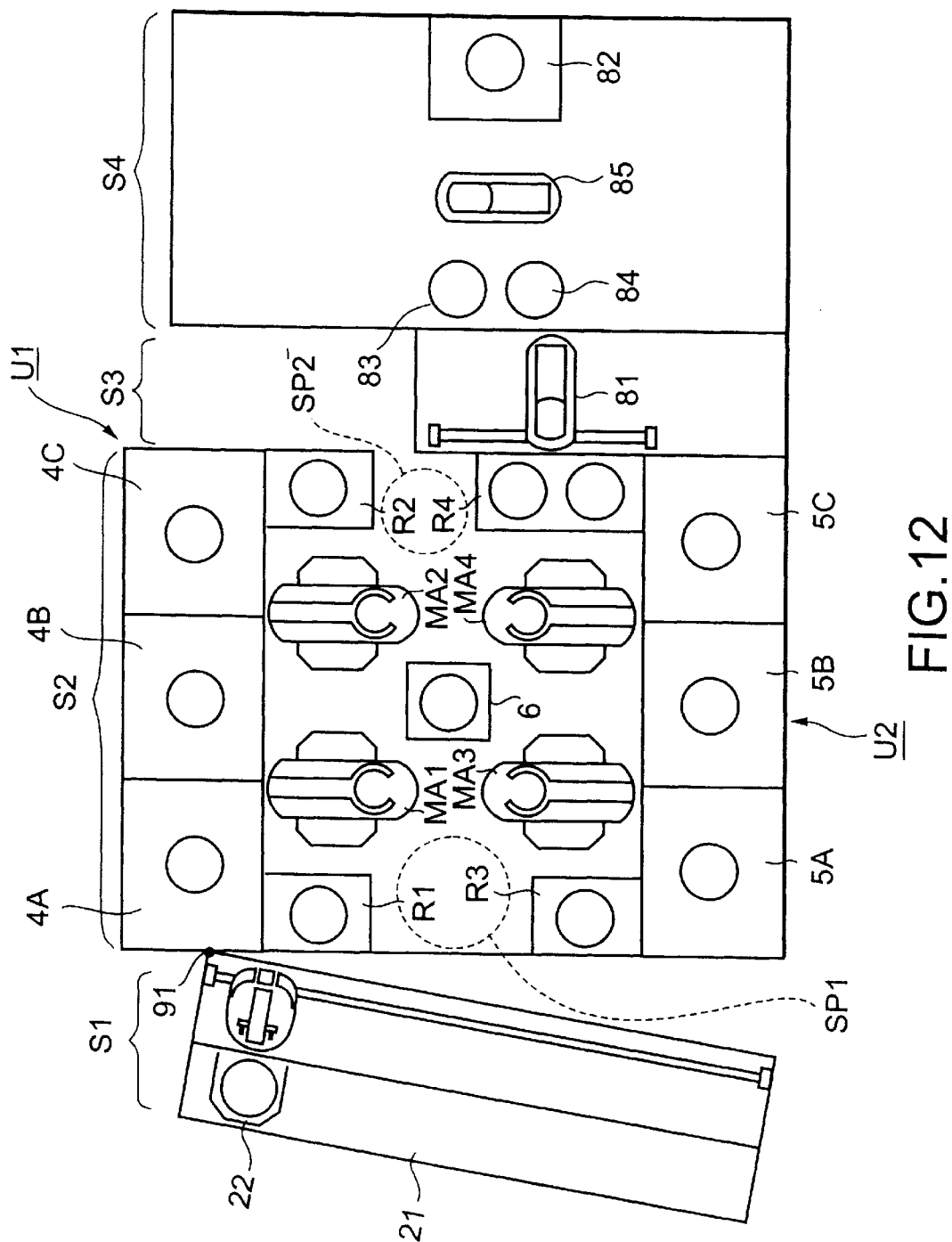
FIG. 12 is a schematic plan view showing a coating and developing apparatus for explaining another embodiment of the present invention.
Figure 13:
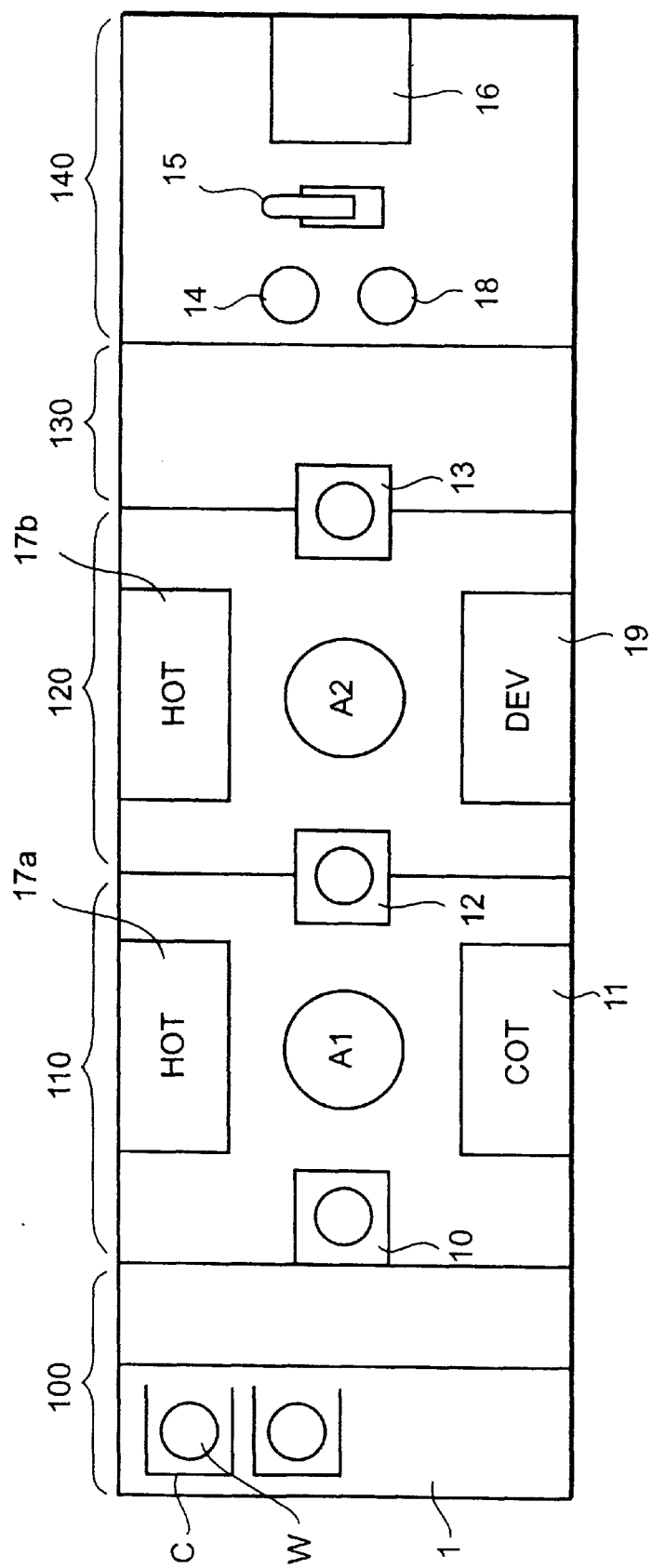
FIG. 13 is a schematic plan view showing a conventional coating and developing apparatus.

Another embodiment of the present invention will be shown in FIG. 12. In the embodiment shown in FIG. 12, the cassette station S1 is pivotally fastened to one side of the processing station S2 at one corner by a pivotally fastening element 91, and thereby the cassette station S1 is attachable to and separable from the processing station S2 in the manner of a door. As a result, access to the working space can be easily obtained. In this embodiment, especially, the delivery arm 23 is moved to the pivotally fastening element 91 side when the cassette station Si is separated from the processing station S2 by the control of a control section the illustration of which is omitted. Thus, trouble caused by contact of the operator with the delivery arm 23 during maintenance can be extremely reduced.

In the aforesaid description, in the present invention, the first processing unit U1 housing the antireflection film forming units 3 and the coating units 4 and the second processing unit U2 housing the developing units 5 are not limited to a two-tiered structure, but they may be three-tiered or four-tiered, or three or more processing sections may be arranged in one tier. Accompanying the above arrangement, the number of the wafer transfer means MA may be four or more, and two or more wafer transfer means may be provided at positions facing onto the row of each of the processing units.

Further, the numbers of the heating sections 24 and the cooling sections 25 of the shelf units R, and the CHP devices 50 are not limited to the aforesaid example, and it is suitable that the CHP devices 50 are provided in the first, second, and third shelf units R1, R2, and R3, and that the wafer W is heated and cooled in the CHP devices 50 after an antireflection film is formed and the resist is applied. The number of the delivery tables 60 of the delivery unit 6 is not limited to three, but may be one or more than one.

Although the delivery of the wafer w between the processing station S2 and the interface station S3 is performed via the delivery section 51 of the fourth shelf unit R4 by the fourth wafer transfer means MA4 in the aforesaid example, a dedicated transfer arm for transferring the wafer W between the processing station S2 and the interface station S3 may be provided, or the peripheral edge aligner 7 may be provided in the interface station S3.

Further, the peripheral edge aligner 7 may be provided in one section of the first processing unit U1, and the process-ing sections of the first processing unit U1 may be allocated to the coating units 4, the antireflection film forming units 3, and the peripheral edge aligner 7, in which case the interface station S3 is provided on the first processing unit U1 side, and thus a space which the operator can get into may be secured in an area adjacent to the second processing unit S2 side in the processing station S2. In this case, for example, the wafer W is transferred by the route of the coating unit 4→the heating section 24→the cooling section 25→the peripheral edge aligner 7→the interface station S3→the aligner S4. In such a structure, also, the interface station S3 can be downsized, thereby making it possible to secure a working space which the operator can enter in the area between the processing station S2 and the aligner S4.

Further, the present invention may be applied to a case where hydrophobic processing is performed instead of forming an antireflection film. In this case, for example, a hydrophobic processing section is provided in the shelf unit R, and after hydrophobic processing is performed there, coating of the resist is performed in the coating unit 4. Moreover, in the present invention, a substrate is not limited to the wafer, and a glass substrate for a liquid crystal display is also suitable.

According to the present invention, the first processing unit and the second processing unit are provided facing to each other, and the substrate transfer means are provided at positions facing onto the rows of these processing units, whereby working spaces can be secured in the processing station, and the depth of the processing station from the cassette station can be shortened. Moreover, according to the present invention, the peripheral edge aligner is provided in the first processing unit or the second processing unit, thus enabling the interface station to be downsized.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:

a cassette station including a mounting section where a substrate cassette is mounted, said substrate cassette housing a plurality of substrates thereon and delivery transfer arm that receives and transfers the substrate from/to the substrate cassette mounted on the mounting section; and a processing station, connected to said cassette station, that processes the substrate transferred by the delivery transfer arm, said processing station further comprising:

a first processing unit in which a plurality of processing sections are arranged in a direction orthogonal to the lengthwise direction of said, cassette station;

a second processing unit in which a plurality of processing sections are arranged so as to be parallel to and face the processing sections of said first processing unit;

a first transfer apparatus, disposed at a position-facing onto the row of said first processing unit, that receives and transfers the substrate from/to the processing sections composing said first processing unit; and a second transfer apparatus, disposed at a position facing onto the row of said second processing unit, that receives and transfers the substrate from/to the processing sections composing said second processing unit as located on a plane parallel with said first transfer apparatus in the first and second processing units direction, wherein a working space is formed in an area between said first processing unit and said second processing unit and adjacent to said cassette station in said processing station.

2. The apparatus as set forth in claim 1, wherein said first processing unit has three or more processing sections arranged in the direction orthogonal to the lengthwise direction of said cassette station, wherein said second processing unit has three or more processing sections which are arranged so as to face the processing sections composing said first processing unit, wherein said first transfer apparatus has two or more transfer mechanisms, disposed at positions facing onto the row of said first processing unit, that receives and transfers the substrate from/to the, processing sections composing said first processing unit, and wherein said second substrate transfer means has two or more transfer mechanisms, disposed at positions onto the row of said second processing unit, for receiving and sending the substrate from/to the processing sections composing said second processing unit.

3. The apparatus as set forth in claim 1, wherein said processing station includes a delivery table that delivers the substrate between said first transfer apparatus and said second transfer apparatus.

4. The apparatus as set forth in claim 1, wherein said first processing unit and said second processing unit include a processing section that process a coating solution for the substrate.

5. The apparatus as set forth in claim 1, further comprising:

an interface station, that can be connected with an aligner provided on the opposite side to-said cassette station of said processing station and connected to the side opposite to said cassette station of said processing station, that delivers the substrate between said processing station and the aligner, wherein said first processing unit includes a processing section that processes a resist solution for the substrate, and said second processing unit includes a processing section that develops the substrate exposed in the aligner.

6. The apparatus as set forth in claim 5, wherein said processing station includes a peripheral edge aligner that exposes a peripheral edge area outside a circuit forming area of the substrate for the substrate of which the circuit forming area is exposed in the aligner, and the peripheral edge aligner is provided in one section of said first processing unit.

7. The apparatus as set forth in claim 5, wherein said processing station includes a peripheral edge aligner that exposes a peripheral edge area outside a circuit forming area of the substrate for the substrate of which the circuit forming area is exposed in the aligner, and the peripheral edge aligner is provided in one section of said second processing unit.

8. The apparatus as set forth in claim 5, wherein the width of said interface station is smaller than the width of said processing station, and a passage for access to the working space is secured by a space formed by a difference between the widths of said interface station and said processing station.

9. The apparatus as set forth in claim 1, wherein said cassette station is removably connected to said processing station so as to be attachable to and separable from said processing station.

10. The apparatus as set forth in claim 9, wherein said cassette station is pivotally fastened on one side of said processing station and attachable to and separable from said processing station in the manner of a door.

11. The apparatus as set forth in claim 10, wherein the delivery transfer arm in said cassette station has a transfer mechanism that transfers the substrate in the width direction of said cassette station, and wherein the transfer mechanism temporarily moves to a side on which said cassette station is pivotally fastened to said processing station when said cassette station is separated from said processing station.

12. The apparatus as set forth in claim 3, wherein the delivery table is disposed at an upper position.

13. The apparatus as set forth in claim 1, wherein:

said first transfer apparatus includes first substrate transfer apparatus and second substrate transfer apparatus, aligned at positions facing onto the row of said first processing unit, that receives and sends the substrate from/to the processing sections composing said first processing unit, and said second transfer apparatus includes third substrate transfer apparatus and fourth substrate transfer apparatus, aligned at positions facing onto the row of said second processing unit, that receives and sends the substrate from/to the processing sections composing said second processing unit, said third and fourth substrate transfer apparatus provided parallel with said first and second substrate transfer apparatus so that said first and second transfer apparatus face each other.

* * * * *